United States Patent [19]

Tatsumi

[11] Patent Number: 5,475,337
[45] Date of Patent: Dec. 12, 1995

[54] SWITCHED CAPACITOR AMPLIFIER CIRCUIT

[75] Inventor: Satoshi Tatsumi, Tokyo, Japan

[73] Assignee: NEC Corporation, Tokyo, Japan

[21] Appl. No.: 391,274

[22] Filed: Feb. 21, 1995

Related U.S. Application Data

[63] Continuation of Ser. No. 91,880, Jul. 15, 1993, abandoned.

[30] Foreign Application Priority Data

Jul. 24, 1992 [JP] Japan .................................. 4-197978

[51] Int. Cl.⁶ .............................. H03B 1/00; G02F 00/00
[52] U.S. Cl. .......................... 327/551; 327/554; 327/334
[58] Field of Search ................................ 307/491, 520, 307/542, 246; 328/162, 165; 327/554, 551, 552, 563, 334, 565; 330/252, 260, 51, 9

[56] References Cited

U.S. PATENT DOCUMENTS

| | | | |
|---|---|---|---|
| 4,429,281 | 1/1984 | Ito | 327/554 |
| 4,439,693 | 3/1984 | Lucas et al. | 327/85 |
| 4,656,871 | 4/1987 | Czarnocki | 330/282 |
| 4,894,620 | 1/1990 | Nagaraj | 327/554 |
| 5,331,222 | 7/1994 | Lin | 327/554 |

FOREIGN PATENT DOCUMENTS 1286513  11/1989  Japan ...................................... 330/51

OTHER PUBLICATIONS

IEEE Journal of Solid State Circuits, vol. SC–22, No. 1, Feb '1987, pp. 104–106 Ken Martin et al.

Primary Examiner—Anita Pellman Gross
Assistant Examiner—Tiep H. Nguyen
Attorney, Agent, or Firm—Young & Thompson

[57] ABSTRACT

In a switched capacitor amplifier circuit of an offset cancellation type, a capacitor is arranged between a reverse input terminal of an operational-transconductance amplifier and a reference voltage. Only in an offset cancelling operation in which a first group of switches are on, the capacitor functions as a load of the amplifier. The capacitor hence does not exert any influence upon transfer of charge. With provision of the circuit, the phenomenon of oscillation is suppressed in the operation to cancel the offset voltage.

4 Claims, 4 Drawing Sheets

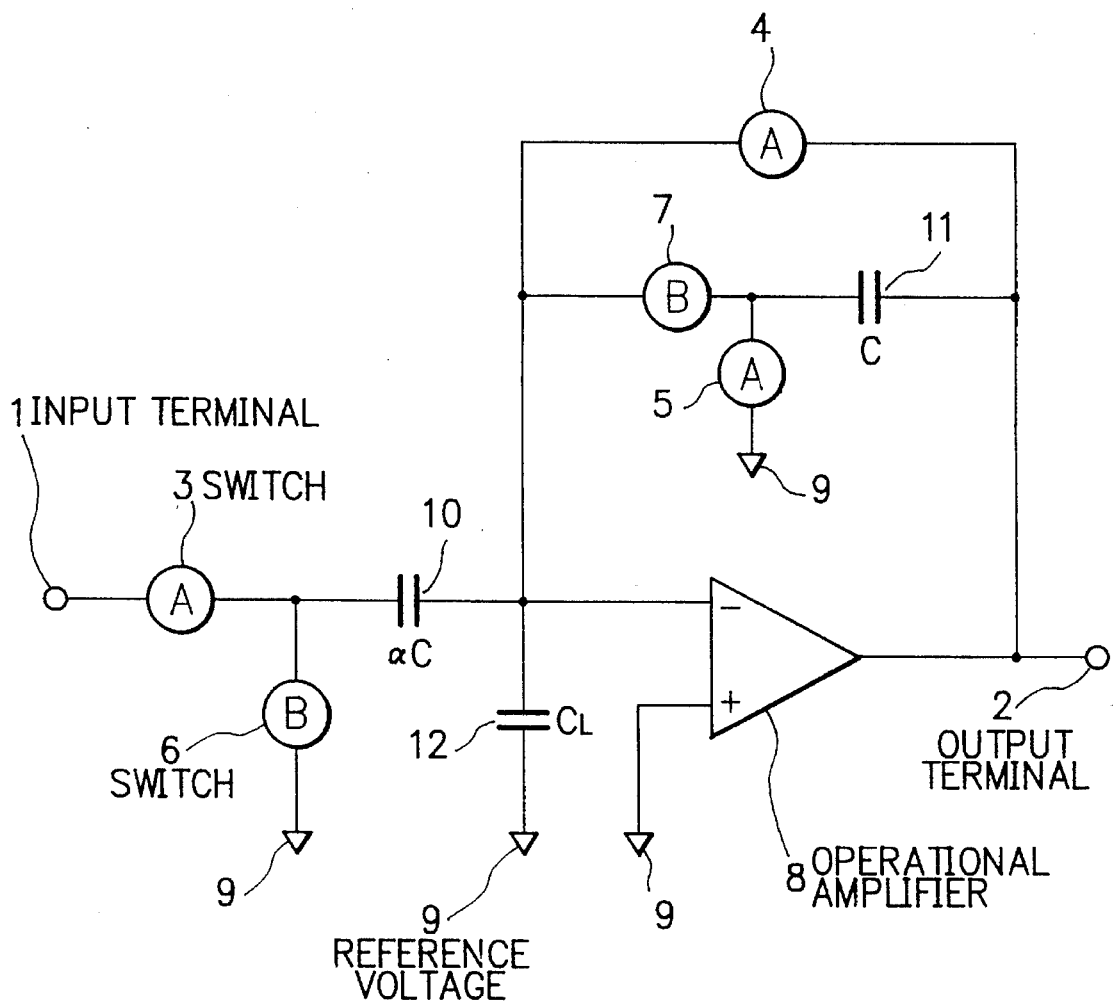

SWITCHED CAPACITOR AMPLIFIER CIRCUIT

This application is a continuation of application Ser. No. 08/091,880, filed Jul. 15, 1993, now abandoned.

BACKGROUND OF THE INVENTION

The present invention relates to an amplifier circuit, and in particular, to a switched capacitor amplifier circuit capable of automatically compensating for an offset voltage.

DESCRIPTION OF THE RELATED ART

In an operational amplifier, due to a characteristic of a pair of transistors in a first stage, there appears a direct-current (dc) offset voltage, which possibly causes an output error. Heretofore, to overcome this difficulty, a switched capacitor amplifier circuit includes a circuit to automatically compensate for the offset voltage. FIG. 1 shows an example of the conventional amplifier circuit achieving compensation for offset voltage.

The constitution of FIG. 1 includes switches A 3 to 5 each being turned on or off by a clock signal A and switches B 6 and 7 each being set to an on or off state in response to a clock signal B. The clocks A and B are shifted from each other by half a period thereof and are not overlapped with each other. In consequence, when the switches A 3 to 5 are on, the switches B 6 and 7 are off in any case and vice versa.

FIG. 2A shows a state of circuit in an offset cancellation in which the switches A 3 to 5 are on due to the clock signal A; whereas, FIG. 2B shows a state of circuit in an amplifying operation in which the switches B 6 and 7 are on in response to the clock signal B. In this configuration, when the switches A 3 to 5 and capacitors $\alpha C$ 10 and C 11 are on, an operational amplifier 8 functions as an amplifier developing a gain "1". Resultantly, the capacitors $\alpha C$ 10 and C 11 are respectively charged up to Vos−Vin and Vos, thereby producing an output voltage Vos.

Assume next that when the switches B 6 and 7 are on, there is developed an output voltage Vout as shown in FIG. 2B. In this situation, the capacitors $\alpha C$ 10 and C 11 are respectively charged up to Vos and Vos−Vout. Since the quantity of electric charge in a reverse input terminal of the amplifier 8 is fixed, $$\alpha C(Vos-Vin)+CVos=\alpha CVos+C(Vos-Vout)$$

holds. Consequently, there is obtained.

$$Vout=\alpha Vin.$$

This means that the offset voltage is cancelled out and hence does not exercise any influence upon the output voltage.

According to the conventional switched capacitor amplifier circuit of the offset cancellation type, when the switches A are on, the operational amplifier serves as a unity gain buffer. In a case where the amplifier belongs to a type of operational-transconductance amplifiers (OTAs), there has been a problem that the amplifier easily initiates a signal oscillation. As well known in the art, the OTA-type operational amplifier comprises an operational transconductance amplifier for converting a voltage difference between reverse and non-reverse input terminals thereof into a corresponding current, and an output load for converting that current into an output voltage.

SUMMARY OF THE INVENTION

It is therefore an object of the present invention to provide a switched capacitor amplifier circuit in which a load is imposed on an output of an operational amplifier thereof only when cancelling an offset voltage thereof, thereby suppressing a phenomenon of signal oscillation.

In accordance with the present invention, there is provided a switched capacitor amplifier circuit including an operational amplifier having a non-reverse input terminal connected to a reference voltage, and a first capacitor connected between a reverse input terminal of the operational amplifier and the reference voltage. The first capacitor serves as a load of the operational amplifier only when the circuit achieves cancellation of an offset voltage.

BRIEF DESCRIPTION OF THE DRAWINGS

The objects, features of the present invention will become more apparent from the consideration of the following detailed description taken in conjunction with the accompanying drawings in which:

FIG. 2A is a circuit diagram showing a state of the circuit in which switches A of FIG. 1 are on:

FIG. 2B is a diagram showing a circuit state in which switches B of FIG. 1 are on:

FIG. 3 is a diagram schematically showing the constitution of an embodiment of a switched capacitor amplifier circuit in accordance with the present invention:

FIG. 4A is a circuit diagram showing a state of the circuit in which switches A of FIG. 3 are on: and FIG. 4B is a diagram showing a circuit state in which switches B of FIG. 3 are on.

DESCRIPTION OF THE PREFERRED EMBODIMENTS

Figure 1:
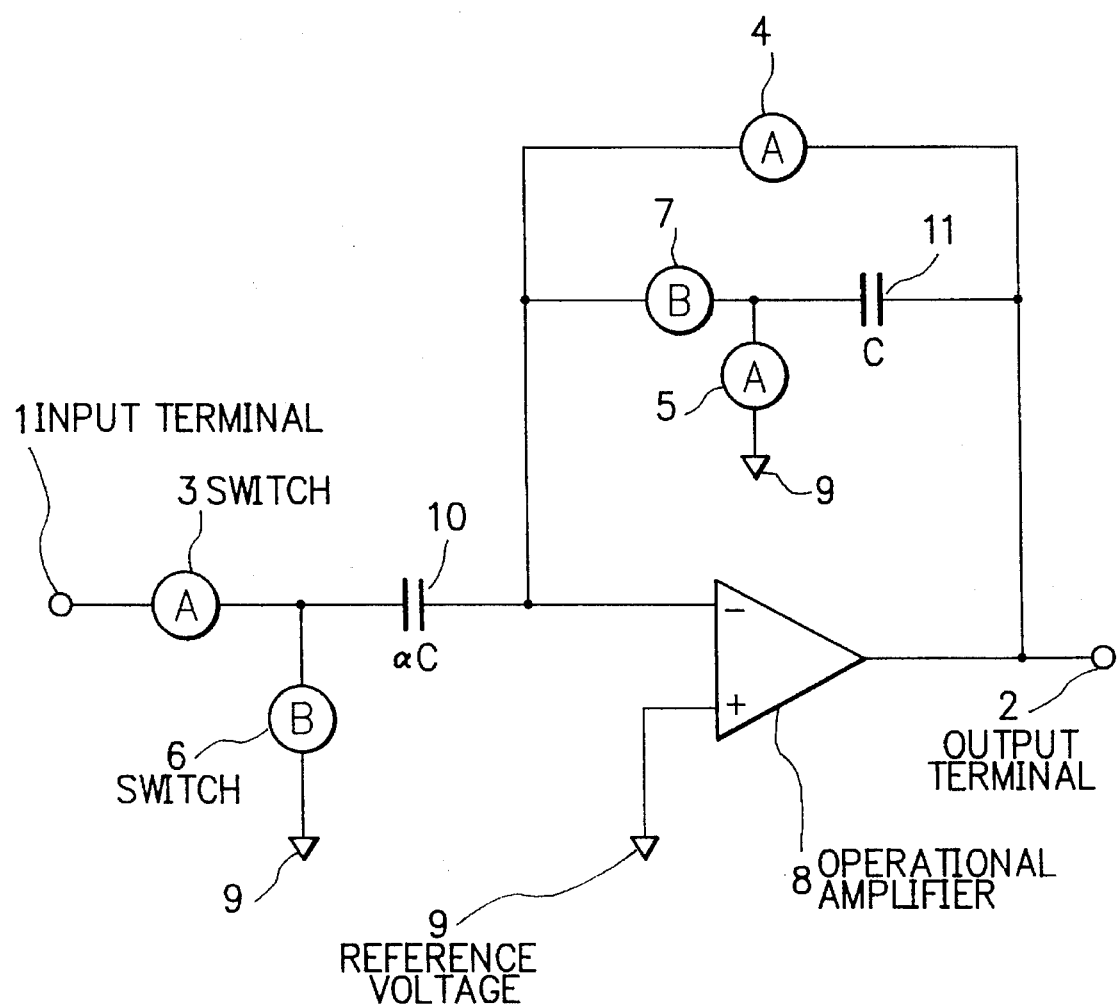
FIG. 1 is a schematic diagram showing the configuration of a switched capacitor amplifier circuit in the prior art.

Referring now to the accompanying drawings, description will be given of an embodiment in accordance with the present invention.

FIG. 8 shows the structure of an embodiment of a switched capacitor amplifier circuit in accordance with the present invention.

The circuit construction includes a signal input terminal connected via a switch A 3 and a capacitor $\alpha C$ 10 to a reverse input terminal of an operational amplifier 8. The amplifier has a non-reverse input terminal linked with a reference voltage source 9. A connecting point between the switch A 3 and the capacitor $\alpha C$ 10 is connected to the reference voltage source 9. The reverse input terminal of the amplifier 8 is also coupled with the voltage supply 9 via a capacitor $C_L$.

Moreover, the reverse input terminal is connected via a switch A 4 to an output terminal 2 of the amplifier 8 as well as via a switch B 7 and a capacitor C 11 to the output terminal 2 of the amplifier 2. A connection point between the switch B7 and the capacitor C11 is coupled with the voltage source 9 via a switch A 5.

The circuit constitution of FIG. 1 differs from that of the conventional example shown in FIG. 1 in that the capacitor $C_L$ is disposed between the reverse input terminal of the amplifier 8 and the reference voltage source 9.

Figure 4A:
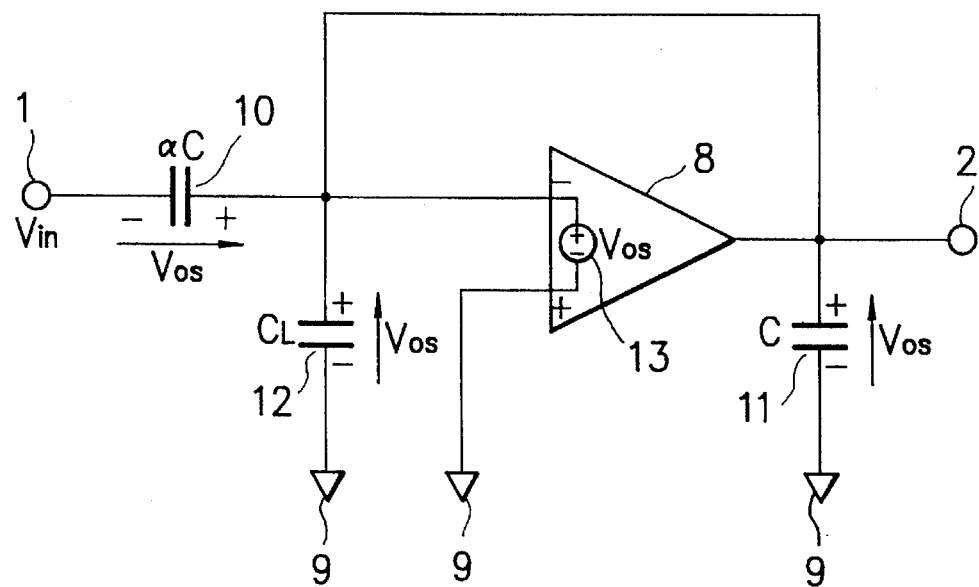
Figure 4B:
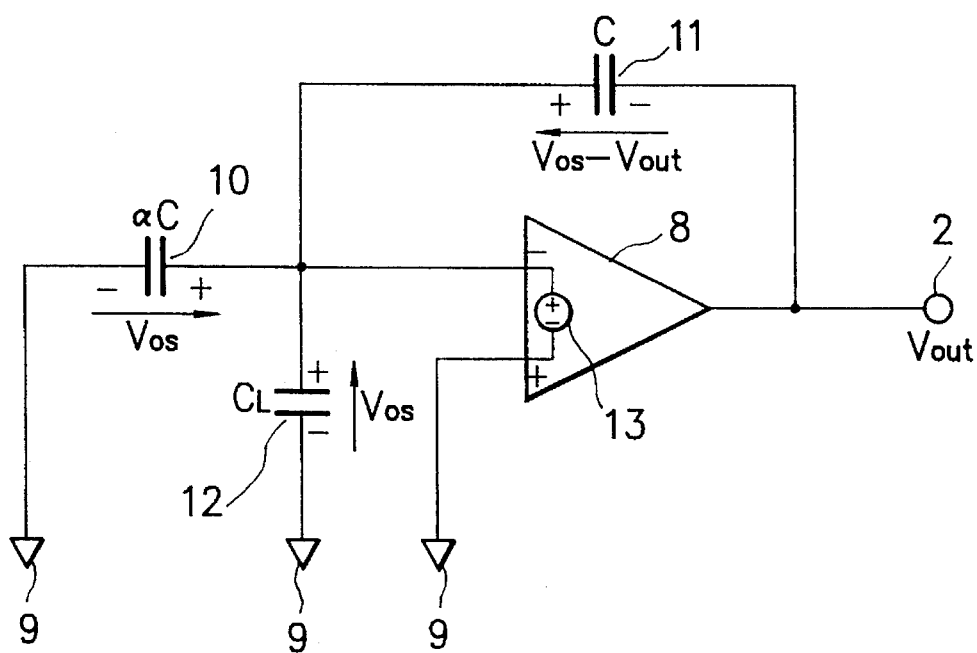

FIG. 4A shows a state of the circuit in an offset cancellation in which the switches A 3 to 5 of FIG. 3 are on; whereas, FIG. 4B shows a state of the circuit in an amplifying operation in which the switches B 6 and 7 of FIG. 3 are on.

Figure 2A:
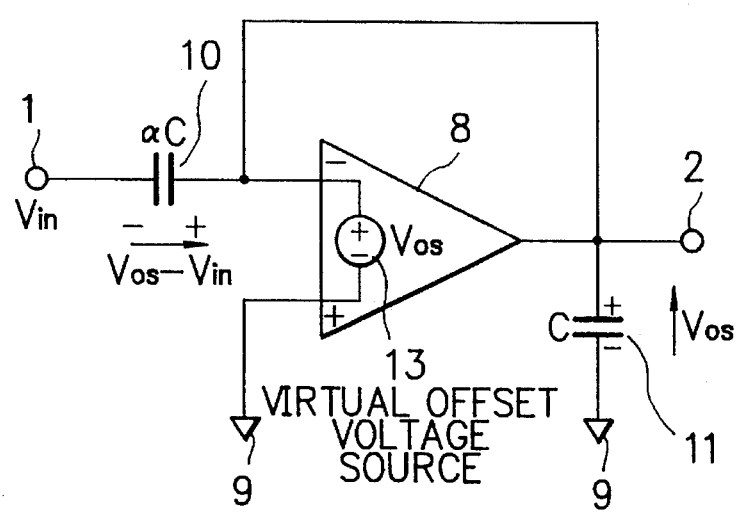

In the state where the switches A 3 to 5 are on, the operational amplifier 8 functions as a voltage follower circuit like in the conventional example of FIG. 2A such that the capacitors αC 10 and 11 are charged up to voltages Vos–Vin and Vos, respectively. Moreover, the capacitor $C_L$ 12 additionally disposed in the circuit structure is charged up to Vos so as to serve as a load of the operational amplifier 8 in this circuit system. In the conventional example of FIG. 2A, only the capacitor C functions as the load. In comparison therewith, in the circuit in accordance with the present invention, the capacitor $C_L$ also functions as the load. Namely, the total load is increased to $C+C_L$.

Figure 2B:
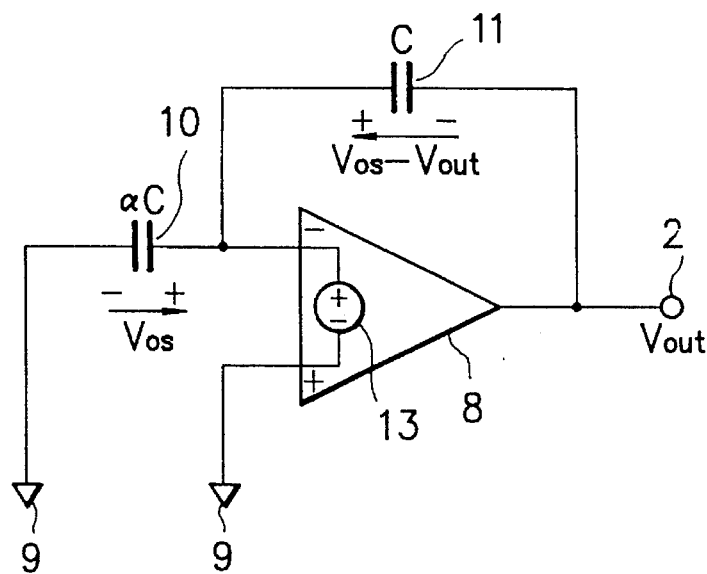

Subsequently, when the switches B 6 and 7 are on, also like in the conventional example of FIG. 2B, the capacitors αC 10 and 11 are charged up to voltages Vos and Vos–Vout, respectively. Under this condition, the capacitor $C_L$ 12 is kept at Vos, namely, in the charged state thereof developed when the switches A 3 to 5 are on, which hence is not related to signal transfer at all. In consequence, the capacitor $C_L$ 12 of the circuit does not exert any influence upon signal transfer, i.e., transfer of charge at all. Namely, only when the operational amplifier 8 functions as a unity gain buffer, the capacitor $C_L$ 12 serves as the load. Consequently, the phenomenon of oscillation is suppressed.

As described above, in accordance with the present invention, the switched capacitor amplifier circuit of the offset cancellation type includes a capacitor between a reverse input terminal of an OTA-type operational amplifier and a reference voltage source. Consequently, a load is imposed on an output from the operational amplifier only when there is conducted an operation to cancel the offset voltage, which leads to an advantageous effect of suppression of the phenomenon of oscillation.

While the present invention has been described with reference to the particular illustrative embodiment, it is not to be restricted by those embodiment but only by the appended claims. It is to be appreciated that those skilled in the art can change or modify the embodiment without departing from the scope and spirit of the present invention.

What is claimed is:

1. A switched capacitor amplifier circuit in which an offset voltage is cancelable, comprising:

an operational amplifier provided with a reverse input terminal connected to an input voltage and a non-reverse input terminal connected to a reference voltage, said operational amplifier amplifying a voltage difference between the input voltage and the reference voltage to produce an output voltage at an output terminal of said circuit, to thereby produce the offset voltage due to the voltage difference at the output terminal, and a capacitor added to said operational amplifier, said capacitor being connected between the reverse input terminal and the reference voltage, so that said capacitor serves as a load for said operational amplifier only when the offset voltage is canceled in said circuit.

2. A switched capacitor amplifier circuit in which an offset voltage is cancelable, comprising:

an operational amplifier provided with a reverse input terminal connected to an input voltage and a non-reverse input terminal connected to a reference voltage, said operational amplifier amplifying a voltage difference between the input voltage and the reference voltage to produce an output voltage at an output terminal of said circuit, to thereby produce the offset voltage due to the voltage difference at the output terminal, and a capacitor added to said operational amplifier, said capacitor being connected between the reverse input terminal and the reference voltage, so that said capacitor serves as a load for said operational amplifier only when the offset voltage is canceled in said circuit;

another capacitor connected between the reverse input terminal and a signal input terminal of said circuit;

a first switch interconnected between said another capacitor and the signal input terminal;

a second switch connected between an interconnection between said another capacitor and said first switch, and the reference voltage;

still another capacitor connected between the reverse input terminal and the output terminal;

a third switch connected between the reverse input terminal and the output terminal;

a fourth switch interconnected between said still another capacitor and the reverse input terminal;

a fifth switch connected between an interconnection between said fourth switch and said still another capacitor, and the reference voltage;

a first switch group consisting of said first, said third, and said fifth switches;

a second switch group consisting of said second and said fourth switches; and said first and said second switch groups turning on and off in accordance with a first clock signal and a second clock signal that are separated from each other and shifted relative to each other by half a period thereof.

3. The circuit as claimed in claim 2, wherein:

said operational amplifier comprises an operational-transconductance amplifier.

4. A switched capacitor amplifier circuit, comprising:

an operational-transconductance amplifier having a non-reverse input terminal connected to a reference voltage;

a first capacitor connected between a reverse input terminal of the amplifier and the reference voltage;

the first capacitor serving as a load of the amplifier only when the circuit achieves cancellation of an offset voltage;

a second capacitor connected to the reverse input terminal of the amplifier;

a first switch connected between the second capacitor and a signal input terminal of the circuit;

a second switch connected between the second capacitor and the reference voltage;

a third switch connected between the reverse input terminal of the amplifier and an output terminal of the circuit;

a fourth switch and a third capacitor connected between the reverse input terminal of the amplifier and the output terminal of the circuit in parallel with the third switch; and a fifth switch connected between the fourth switch, the third capacitor, and the reference voltage;

a first switch group consisting of the first, third, and fifth switches; and a second switch group consisting of the second and fourth switches;

said first and said second switch groups turning on and off in accordance with a first clock signal and a second clock signal that are separated from each other and shifted relative to each other by half a period thereof.

* * * * *